(12) United States Patent
Bois et al.

(10) Patent No.: US 12,525,375 B2
(45) Date of Patent: Jan. 13, 2026

(54) AC-COUPLING STRUCTURE IN ELECTRICAL CABLED INTERCONNECT

(71) Applicant: Hewlett Packard Enterprise Development LP, Spring, TX (US)

(72) Inventors: Karl J. Bois, Fort Collins, CO (US); James David Stewart, Fort Collins, CO (US); David P. Kopp, Fort Collins, CO (US); Elene Chobanyan, Fort Collins, CO (US)

(73) Assignee: Hewlett Packard Enterprise Development LP, Spring, TX (US)

( * ) Notice: Subject to any disclaimer, the term of this patent is extended or adjusted under 35 U.S.C. 154(b) by 0 days.

(21) Appl. No.: 18/491,907

(22) Filed: Oct. 23, 2023

(65) Prior Publication Data

US 2024/0055157 A1   Feb. 15, 2024

Related U.S. Application Data

(63) Continuation of application No. 17/068,344, filed on Oct. 12, 2020, now Pat. No. 11,810,689.

(51) Int. Cl.
*H01B 11/06* (2006.01)
*H01B 11/18* (2006.01)
*H01B 13/016* (2006.01)
*H01P 3/06* (2006.01)
*H01R 12/72* (2011.01)
*H01R 12/75* (2011.01)

(52) U.S. Cl.
CPC ..... *H01B 11/1808* (2013.01); *H01B 11/1856* (2013.01); *H01B 13/0167* (2013.01); *H01P 3/06* (2013.01); *H01R 12/722* (2013.01); *H01R 12/75* (2013.01)

(58) Field of Classification Search
CPC ...................................... H01B 11/06
See application file for complete search history.

(56) References Cited

U.S. PATENT DOCUMENTS

| 4,987,391 A * | 1/1991 | Kusiak, Jr. ............ H03H 7/004 361/111 |
| 6,383,858 B1 * | 5/2002 | Gupta ................. H01L 23/5223 438/238 |

(Continued)

FOREIGN PATENT DOCUMENTS

CA    2936482    *  1/2018

*Primary Examiner* — Chau N Nguyen
(74) *Attorney, Agent, or Firm* — Yao Legal Services, Inc.

(57) ABSTRACT

A signal cable for an AC-coupled link, may include: a signal conductor; a dielectric surrounding the signal conductor; and a ground sheath having a conductive layer disposed at least partially around the conductor such that the dielectric is positioned between the ground sheath and the signal conductor, wherein the conductive layer comprises a first portion extending in a first direction along the cable and a second portion extending in a second direction, opposite the first direction, along the cable and further wherein the first and second portions of the conductive layer are separated from each other by a gap, the gap being dimensioned to provide a determined amount of capacitance in series in the ground sheath. The gap may form a complete separation between the first and second portions of the conductive layer.

11 Claims, 7 Drawing Sheets

(56) References Cited

U.S. PATENT DOCUMENTS

| | | | | |
|---|---|---|---|---|
| 6,452,105 | B2 * | 9/2002 | Badii | H01B 11/1895 |
| | | | | 174/102 R |
| 9,046,342 | B2 * | 6/2015 | Xiao | G01B 15/06 |
| 10,345,340 | B2 * | 7/2019 | Gravermann | G01R 15/16 |
| 11,810,689 | B2 * | 11/2023 | Bois | H01B 11/1856 |
| 2004/0251042 | A1 * | 12/2004 | Weiner | G01R 33/285 |
| | | | | 174/36 |
| 2007/0037419 | A1 * | 2/2007 | Sparrowhawk | H01B 11/1008 |
| | | | | 439/98 |
| 2021/0175706 | A1 * | 6/2021 | Nagatani | H01L 23/60 |

* cited by examiner

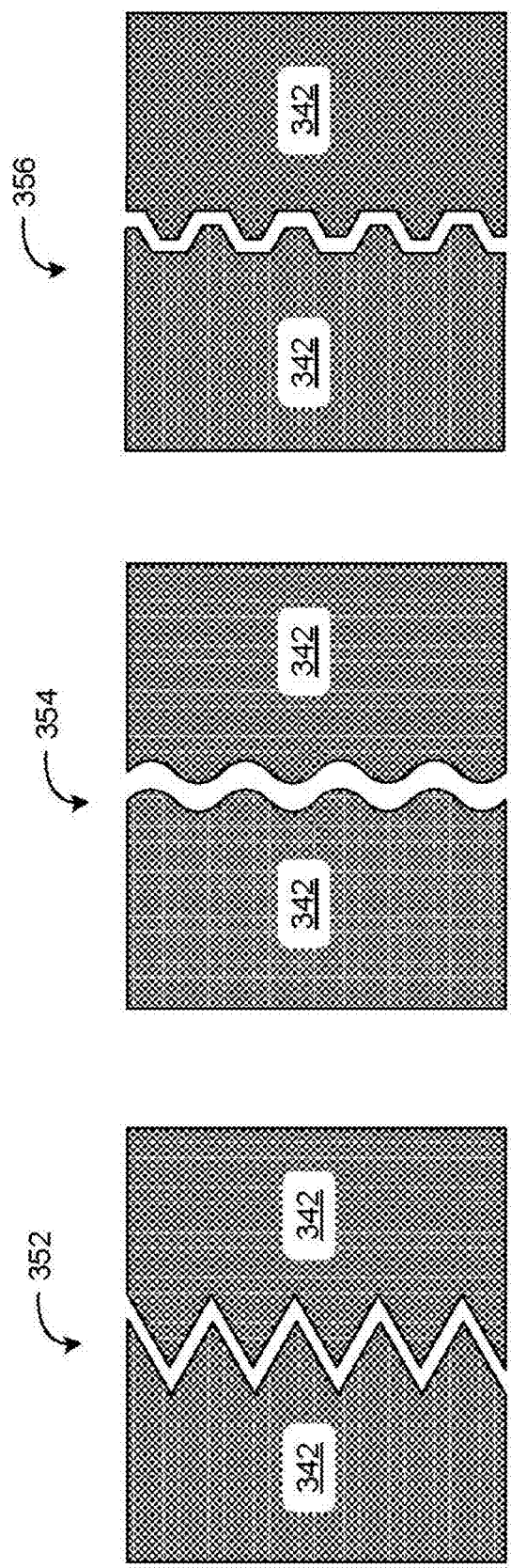

AC-COUPLING STRUCTURE IN ELECTRICAL CABLED INTERCONNECT

CROSS-REFERENCE TO RELATED APPLICATIONS

This application is a continuation application of and claims priority to application Ser. No. 17/068,344, filed on Oct. 12, 2020, the contents of which are hereby incorporated by reference in their entireties.

DESCRIPTION OF RELATED ART

In high speed electrical channels and interconnects, the transmitter (TX) and receiver (RX) devices are often DC isolated from each other using AC-coupling capacitors. Conventional technologies utilize a capacitor connected in series in the signal path to serve as a DC blocker to allow the receiver to control its common mode voltage. The AC-coupling capacitor allows the high-frequency AC signal to pass while blocking the DC signal. However at higher data rates, the electrical degradation of signal performance due to this structure is more pronounced. The AC-coupling capacitors, their mounting pads and the associated PCB plated through holes (PTH), or vias, to connect them can cause appreciable electrical degradation.

Current data rate trends using Ethernet as an example show increases from 25.78125 to 53.125 to 106.25 Gb/s per differential pair. Increasingly, cabled interconnects are being equally used for external and internal linking of the electrical physical medium. However, even in such cases, the AC-coupling capacitors are generally included on the surrogate mounting PCBs used to transition from the cables to standard PCB technology.

BRIEF DESCRIPTION OF THE DRAWINGS

The present disclosure, in accordance with one or more various embodiments, is described in detail with reference to the following figures. The figures are provided for purposes of illustration only and merely depict typical or example embodiments.

FIG. 6 illustrates a few example configurations for a break in the ground sheath to provide capacitance.

The figures are not exhaustive and do not limit the present disclosure to the precise form disclosed.

DETAILED DESCRIPTION

Embodiments of the technology disclosed herein do not utilize in-series capacitors in the signal lines to provide an AC-coupled link. Instead, they provide a break in the ground path to provide a mechanism to block the DC. Embodiments may be implemented that intentionally create a physical ground break in the sheath of the cable to provide DC blocking for the signal path.

To provide a clean path for AC current propagation at higher frequencies, the shape of the break may be formed as an interdigitated capacitor or otherwise have a castellated or nonlinear shape of some form. The interdigitated or castellated nature of the ground cutout can provide an effective capacitor value to provide acceptable high pass filter properties comparable to those normally provided by placing a physical capacitor in series with the signal line on a PCB or in a cable connector. Although the feature can be positioned at any longitudinal point along the cable, in some embodiments, it may be located at or near one of the ends where the structure can be further ruggedized (e.g., by a strain relief or other physical reinforcement) to prevent variation in the structure performance that might otherwise occur due to flexing of the cable. The ruggedized structure can also be further shielded to address EMI concerns that may arise.

In applications where cables are extruded as a continuous metal shape, this feature can be etched out of the fabricated cable. Because the AC-coupling capacitors can be omitted, embodiments may be configured to meet the same low frequency requirements, reduce the total end to end channel degradation, reduce the Bill of Materials (BOM) cost due to lack of physical discrete capacitors and free up PCB real-estate.

Figure 1:
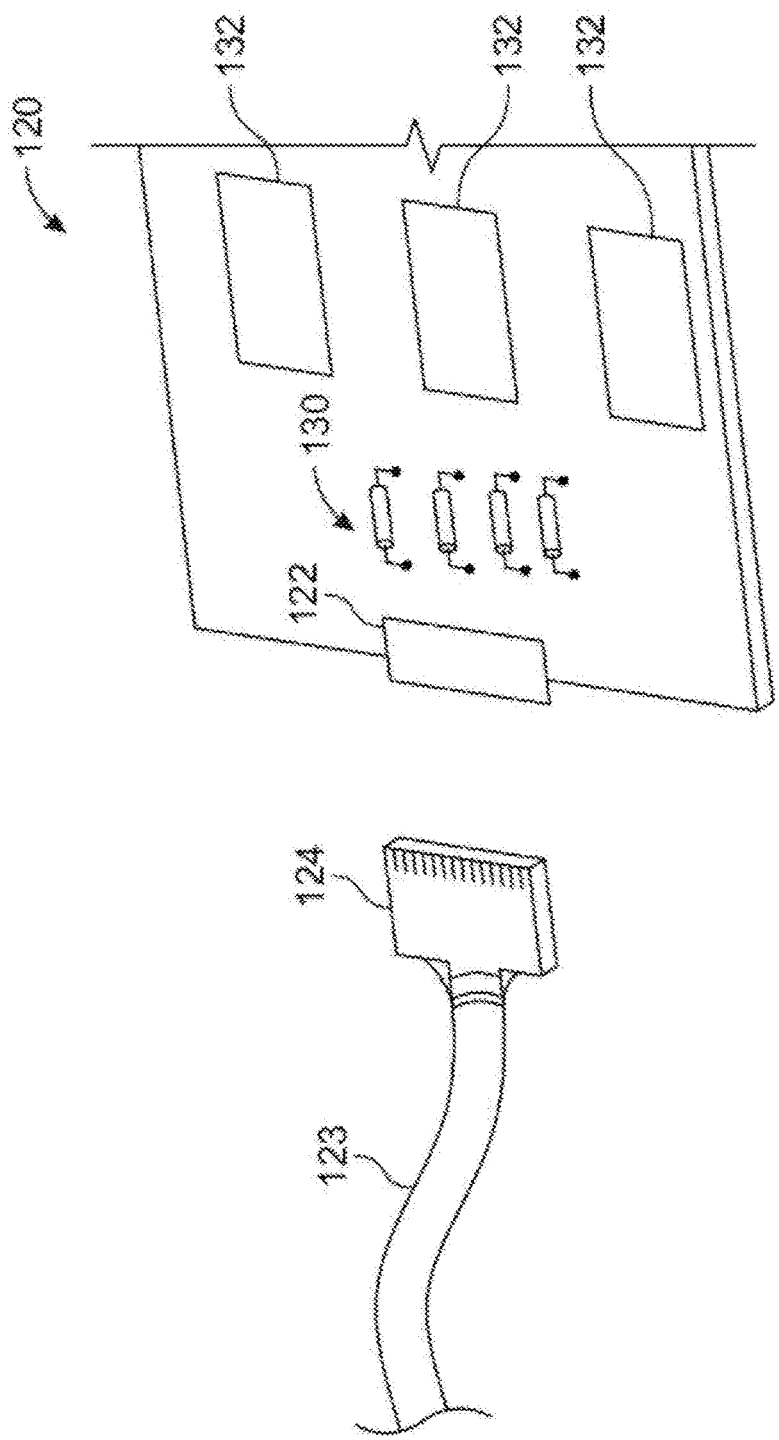
FIG. 1 illustrates an example of a conventional technique for implementing AC coupled links using capacitors in line with AC signal paths.

FIG. 1 illustrates an example of a conventional technique for implementing AC coupled links using capacitors in line with AC signal paths. This example is provided in terms of a circuit board 120 that interfaces with a signal cable 123 via a card connector 122 and a corresponding cable-and connector 124. In this example, printed circuit board 120 includes a plurality of circuit modules 132 which may include, for example, integrated circuit components, discrete components, or other components. Although this example is described in terms of a printed circuit board 120, AC coupling capacitors can be used in any of a plurality of different implementations including, for example, with multichip modules, single-chip circuits, or other circuits. Although four AC coupling capacitors 130 are illustrated, implementations may contain a greater or lesser quantity of capacitors. In various implementations, AC coupling capacitors 130 may also be referred to as DC blocking capacitors.

This example includes a plurality of AC coupling capacitors 130 that are connected in series between their corresponding signal lines of signal cable 123 (e.g., via connectors 122, 124) and their corresponding termination points (e.g., circuits 132) on printed circuit board 120. One or more of AC coupling capacitors 130 may be connected to signal paths on different layers of printed circuit board 120 by way of flow-through holes, or vias. AC coupling capacitors 130 are used to couple AC signals between their respective signal lines of signal cable 123 and their corresponding components on printed circuit board 120. When connected to a load, such as a circuit on printed circuit board 120, each AC coupling capacitor 130, in conjunction with the impedance of the load, forms a high-pass filter that allows AC signals to pass while blocking low frequency signals. Because AC coupling capacitors 130 are able to block low frequencies, including DC, AC coupling capacitors 130 effectively block DC signals from passing, thereby passing only the AC signal. Accordingly, this capacitive coupling typically decreases the low-frequency gain of a system.

Figure 2:
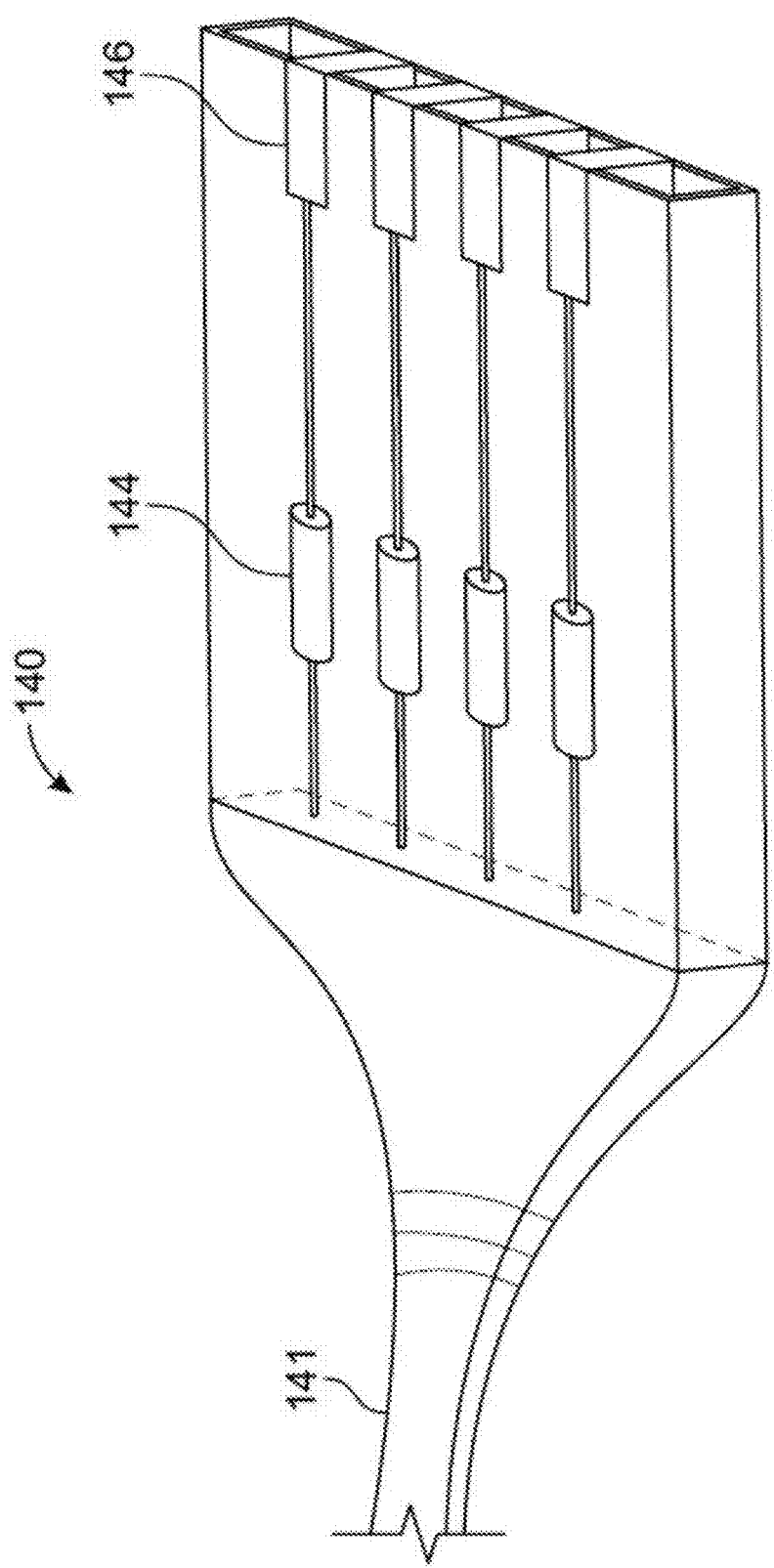
FIG. 2 illustrates another example technique for implementing AC coupled links using capacitors in line with AC signal paths.

FIG. 2 illustrates another example technique for implementing AC coupled links using capacitors in line with AC signal paths. In this example, AC coupling capacitors 144 are embedded within the body of a mating connector 140 and are connected in series in the AC signal links between the signal lines in signal cable 141 and the connectors 146 (e.g., pins or sockets) in connector 140. In this example, AC coupling capacitors 144 perform similarly to AC coupling capacitors 130 in the example of FIG. 1, allowing the AC signals to pass while blocking DC components.

Figure 3:
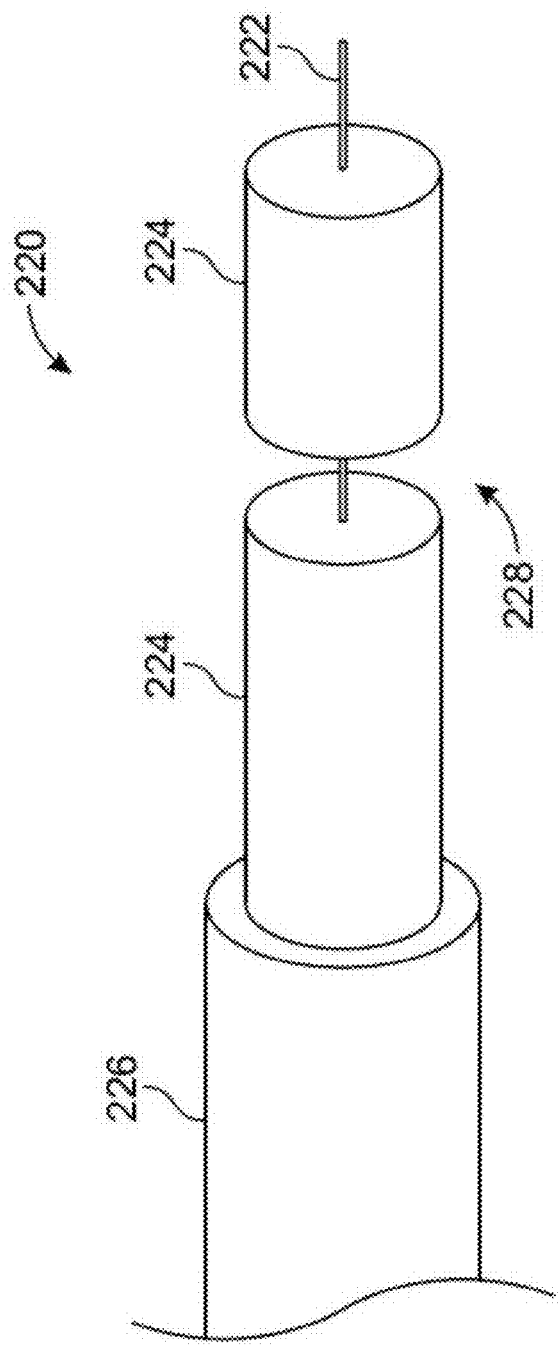
FIG. 3 illustrates an example implementation of using a break in a ground shield of a signal cable in place of a series-connected AC coupling capacitor in accordance with various embodiments.

FIG. 3 illustrates an example implementation of using a break in a ground shield of a signal cable in place of a series-connected AC coupling capacitor in accordance with various embodiments. This example illustrates a coaxial cable 220 including a metallic center conductor 222 to carry AC signals. A metallic cylindrical ground shield 224 is disposed around center conductor 222 to provide a path for the ground return and it may also shield the cable 220. A dielectric 223 or like material may be disposed between the outer cylindrical ground shield 224 and the center conductor 222. An insulating jacket 226 may be provided around ground shield 224.

This example illustrates a break 228 in the cylindrical ground shield 224. This break 228 may be provided as a physical separation partially or completely around the circumference of cylindrical ground shield 224. In embodiments, break 228 may be limited to a break in cylindrical ground shield 224, and either or both of the dielectric material 223 and insulating jacket 226 may remain continuous and unbroken. Providing this break 228 in the outer cylindrical ground shield 224 provides a break in the ground continuity, removing the pure DC component. This break 228 introduces a determined amount of capacitance (the amount dependent upon the geometry of the break) to effectively filter out DC components from the signal carried by coaxial cable 220. Accordingly, embodiments may be implemented without the need for adding a discrete component (e.g., a discrete capacitor) in the signal path to provide the AC coupling and DC filtering. The geometry (e.g., shape and dimensions) of the break may be selected to achieve the desired capacitance level, and hence, the filter characteristics. For example, embodiments may be implement to have a high pass cutoff frequency from about 1 MHz to 1 GHz, although other values can be achieved. The cutoff frequency varies with the protocol and data rate, so capacitance values may be selected accordingly. Representative values of capacitance to achieve such range could be 0.01 uF to 10 pF. For the data rates and protocols targeted at about 100 Gbit per second (per differential pair), for example, the cutoff frequency could reside in the single digit gigahertz values.

The break 228 in the cylindrical ground shield 224 can be provided using a number of different manufacturing techniques. For example, ground shield 224 can be chemically etched or laser etched, post manufacture, to form break 228 of a desired pattern and thickness. As another example, the ground shield 224 can be affixed in place in two pieces with the desired gap separation.

The example illustrated in FIG. 3 shows a straight, or linear, break 228 completely around the circumference of cylindrical ground shield 224. Other shapes of the break 228 can be provided in various embodiments to achieve different performance effects. For example, providing an irregular shape for the break 228 may achieve a larger amount of capacitance. Although the example in FIG. 3 is illustrated and described in terms of a coaxial cable with a single center conductor and a cylindrical shield, embodiments may be implemented with other cable types. For example, embodiments may be implemented with coaxial, triaxial quadraxial, twinaxial, and other cable types.

Figure 4:
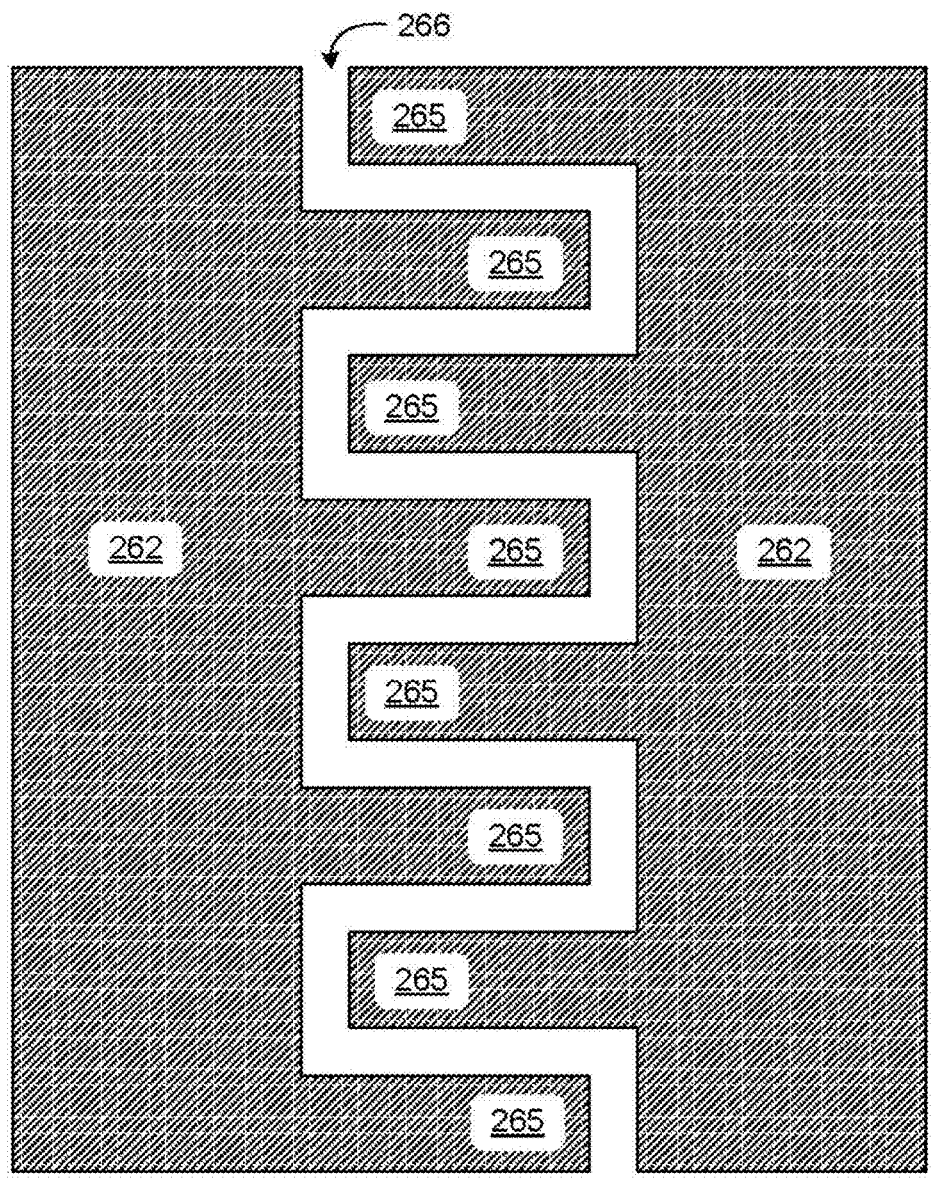
FIGS. 4 and 4A illustrate examples of a segment of a break in the form of an interdigital capacitor in accordance with various embodiments.
Figure 5:
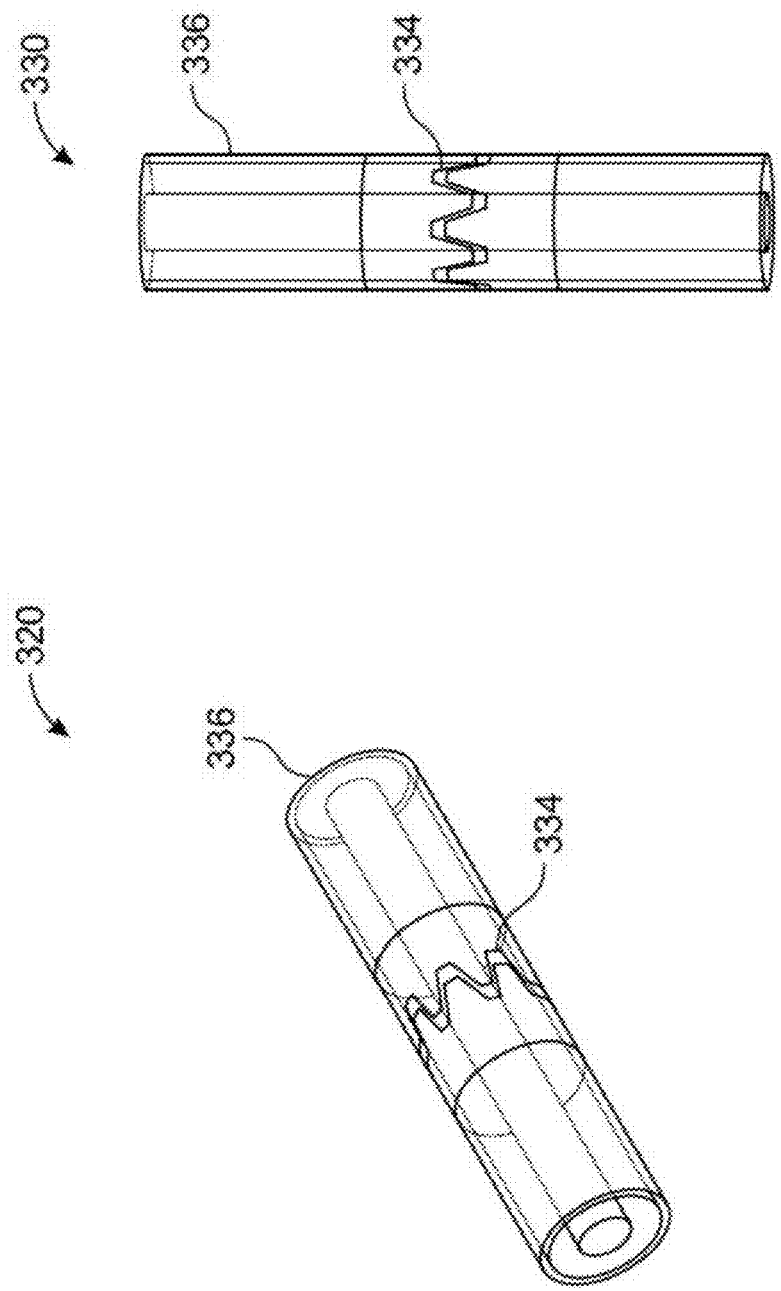
FIG. 5 illustrates an example configuration of a cylindrical ground sheath with a break wrapped around a center conductor.

FIG. 4 illustrates an example segment of a break in the form of an interdigital capacitor in accordance with various embodiments. In this example, a portion of the ground sheath 262 (e.g., ground sheath 244) is illustrated at the area of the break (e.g., break 228) where the capacitance is created in the ground sheath 262. In this case, the break is formed by a series of conductive interlaced fingers 265 separated by a space 266 to form an interdigital capacitor. Ground sheath 262 is illustrated as "flattened out" but normally would be formed in a cylindrical or like fashion so that it can be positioned around the center conductor of the cable (as shown in FIG. 5). Capacitance of the break in this configuration can be adjusted by adjusting parameters such as, for example, one or more of the parameters such as quantity, length and width of fingers 265 and the amount (e.g., width) of spacing 266. In various applications, interdigitating the capacitive element may preserve more consistent electrical behavior as compared to embodiments in which the gap is formed by shield portions having opposed linear edges arranged in parallel to one another. Representative dimensions for an interdigital capacitor could be, for example, a length of 16 mils, a width of the fingers of 4 mils and a spacing of 4 mils. In other examples, the length can range from 8-24 mils, the width of the fingers can range from 1-8 mils and the spacing can range from 1-8 mils. Other dimensions may also be applied depending on the capacitance level sought and the manufacturing tolerances and reliabilities desired. These dimensions are examples only.

FIG. 5 illustrates an example configuration of a cylindrical ground sheath with a break wrapped around a center conductor. View 320 illustrates an isometric view and view 330 illustrates a straight-on view. In this example, the break 334 in the ground sheath 336 is illustrated as being roughly sinusoidal in shape, but it could take other shapes. As with the interdigital example illustrated in FIG. 4, the amount of capacitance provided by the break 334 can vary as a function of parameters such as quantity and geometry of the complementary shapes that form the sinusoidal break 334 in the ground shield 336.

FIG. 6 illustrates three example configurations for a break in the ground sheath to provide capacitance. View 352 illustrates a break in the ground sheath 342 formed by a series of triangles interlaced or interwoven to provide a capacitance between the two portions of the sheath 342. View 354 illustrates a break in ground sheath 342 formed by a sinusoidal patterns of complementary wave-like shapes to provide a capacitance between the two portions of the sheath 342. In this example, the respective edges of the ground sheathes 342 are formed with a sinusoidal pattern. View 356 illustrates a break in ground sheath 342 formed by a series of complementary clipped triangles interlaced to provide a capacitance between the two portions of ground sheath 342. An example spacing can be implemented with a break of 20-200 microns, with one example being 100 microns. Other spacings can be provided depending on the capacitance desired in the manufacturing tolerances and reliabilities desired.

As with the example illustrated in FIG. 4, parameters such as dimensions, geometry and quantities of the patterns used to create the shape of the break can be adjusted to adjust capacitance presented by the break. For example, one or more of the height, width and quantity of features (e.g. triangles, waves and clipped triangles) can be adjusted to adjust the capacitance, as can the spacing between the two portions of the ground sheath 342.

Figure 4A:
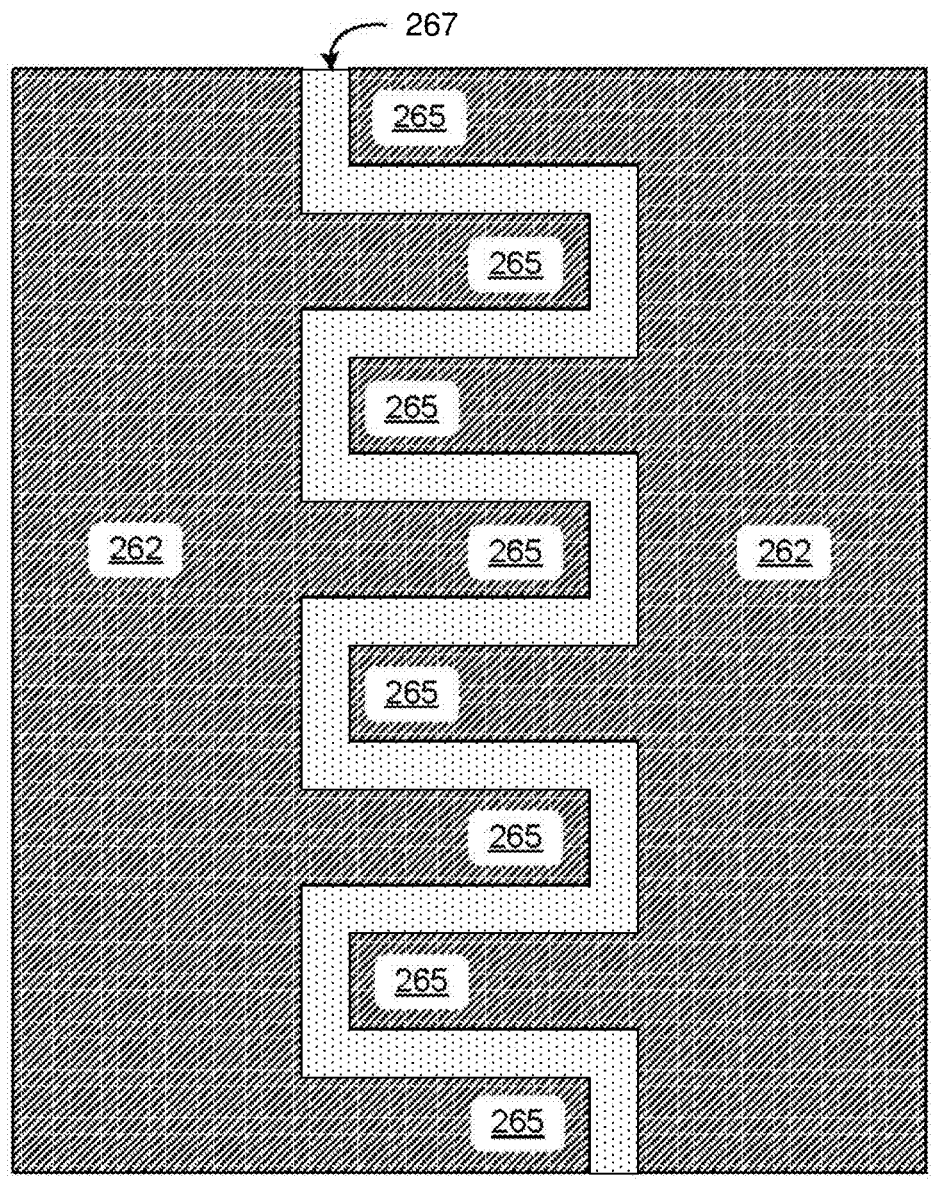

In various embodiments, enhancements may be included to increase or fine tune the capacitance provided by the gap. For example, embodiments may be implemented in which materials are sputtered or otherwise deposited in the area of the gap to affect the amount of charge of the capacitance, as shown in FIG. 4A where materials are sputtered in gap 267. Examples may include materials with very high dielectric constants that may be provided in the gap region to increase the capacitance of the gap. Such materials may include any of a number of different ceramics, including carbon loaded ceramics, glass, mica, oxides, etc. The amount and density of the material provided as well as material type can be selected to achieve a desired amount of capacitance introduced by the gap.

Embodiments may include a signal cable for an AC-coupled link, that includes: a signal conductor; a dielectric surrounding the signal conductor; and a ground sheath having a conductive layer disposed at least partially around the conductor such that the dielectric is positioned between the ground sheath and the signal conductor, wherein the conductive layer comprises a first portion extending in a first direction along the cable and a second portion extending in a second direction, opposite the first direction, along the cable and further wherein the first and second portions of the conductive layer are separated from each other by a gap, the gap being dimensioned to provide a determined amount of capacitance in series in the ground sheath. The gap may form a complete separation between the first and second portions of the conductive layer.

The first conductive portion may include an edge defining a first side of the gap and the second conductive portion may include an edge defining a second side of the gap. In various embodiments, the first edge and the second edge may be straight and arranged parallel to one another. In other embodiments, the first edge and the second edge may each include a plurality of elongate conductive members extending like fingers from their respective edges, and the first edge and the second edge may be positioned to create the gap and to form an interdigital capacitor.

As used herein, the term "or" may be construed in either an inclusive or exclusive sense. Moreover, the description of resources, operations, or structures in the singular shall not be read to exclude the plural. Conditional language, such as, among others, "can," "could," "might," or "may," unless specifically stated otherwise, or otherwise understood within the context as used, is generally intended to convey that certain embodiments include, while other embodiments do not include, certain features, elements and/or steps.

Terms and phrases used in this document, and variations thereof, unless otherwise expressly stated, should be construed as open ended as opposed to limiting. Adjectives such as "conventional," "traditional," "normal," "standard," "known," and terms of similar meaning should not be construed as limiting the item described to a given time period or to an item available as of a given time, but instead should be read to encompass conventional, traditional, normal, or standard technologies that may be available or known now or at any time in the future. The presence of broadening words and phrases such as "one or more," "at least," "but not limited to" or other like phrases in some instances shall not be read to mean that the narrower case is intended or required in instances where such broadening phrases may be absent.

What is claimed is:

1. A signal cable comprising: a conductor to carry electrical signals; a cylindrical ground shield layer around the conductor to provide a return path for the electrical signals, the cylindrical ground shield layer comprising a first continuous portion and a second continuous portion separated by a gap to provide a predetermined amount of capacitance, the gap around a circumference of the cylindrical ground shield layer with a geometry adjusted to provide a capacitance between 10 pF and 0.01 uF, and the gap filled with carbon loaded ceramics and one or more of glass, mica, and oxide; and a dielectric layer positioned between the conductor and the ground shield layer.

2. The signal cable of claim 1, wherein the carbon loaded ceramics is deposited using a sputtering method.

3. The signal cable of claim 1, further comprising one or more additional conductors surrounded by the ground shield layer and the dielectric layer to carry the electrical signals.

4. The signal cable of claim 1, wherein the gap is formed by a first set of conductive fingers belonging to the first continuous portion interleaved with a second set of conductive fingers belonging to the second continuous portion.

5. The signal cable of claim 4, wherein a length of a respective conductive finger in the first or second set of conductive fingers is between 8 and 24 mils, wherein a width of the respective conductive finger is between 1 and 8 mils, and wherein a spacing between adjacent conductive fingers in the first or second set of conductive fingers is between 1 and 8 mils.

6. The signal cable of claim 4, wherein the first and second sets of conductive fingers have a tapered width.

7. The signal cable of claim 6, wherein a respective conductive finger in the first or second set of conductive fingers is shaped as a trapezoid, a triangle, or a sinusoidal wave.

8. The signal cable of claim 1, wherein the signal cable is a coaxial cable, a twinaxial cable, a triaxial cable, or a quadriaxial cable.

9. The signal cable of claim 1, wherein the gap is to block a direct current (DC) component of the electrical signals.

10. The signal cable of claim 9, wherein a high-pass cut-off frequency of the gap is between 1 MHz and 1 GHz.

11. The signal cable of claim 1, wherein the gap is formed by chemical etching or laser etching.

\* \* \* \* \*